United States Patent [19]
Yamamura

[11] Patent Number: 6,163,071
[45] Date of Patent: Dec. 19, 2000

[54] BGA TYPE SEMICONDUCTOR DEVICE AND ELECTRONIC EQUIPMENT USING THE SAME

[75] Inventor: Hideho Yamamura, Yokohama, Japan

[73] Assignee: Hitachi, Ltd., Tokyo, Japan

[21] Appl. No.: 08/757,350

[22] Filed: Nov. 27, 1996

[30] Foreign Application Priority Data

Nov. 29, 1995 [JP] Japan .................................. 7-310861

[51] Int. Cl.⁷ .............................................. H01L 23/52
[52] U.S. Cl. ................................... 257/691; 257/692
[58] Field of Search ......................... 257/734, 730, 257/731, 784, 786, 666, 203, 207, 691, 697, 698, 692

[56] References Cited

U.S. PATENT DOCUMENTS

| | | | |
|---|---|---|---|
| 4,437,141 | 3/1984 | Prokop | 257/784 |
| 4,614,194 | 9/1986 | Jones et al. | 257/734 |
| 5,216,278 | 6/1993 | Lin et al. | 257/734 |
| 5,283,717 | 2/1994 | Hundt | 257/666 |
| 5,285,352 | 2/1994 | Pastore et al. | 257/712 |
| 5,309,016 | 5/1994 | Kasai et al. | 257/666 |
| 5,347,150 | 9/1994 | Sakai et al. | 257/203 |
| 5,442,230 | 8/1995 | Chillara et al. | 257/666 |
| 5,444,303 | 8/1995 | Greenwood et al. | 257/784 |
| 5,457,340 | 10/1995 | Templeton et al. | 257/666 |
| 5,481,133 | 1/1996 | Hsu | 257/730 |
| 5,490,324 | 2/1996 | Newman | 257/700 |
| 5,583,378 | 12/1996 | Marrs et al. | 257/730 |
| 5,592,025 | 1/1997 | Clark et al. | 257/734 |
| 5,672,911 | 9/1997 | Patil et al. | 257/691 |
| 5,691,568 | 11/1997 | Chou et al. | 257/691 |
| 5,741,726 | 4/1998 | Barber | 437/216 |
| 5,801,440 | 9/1998 | Chu et al. | 257/691 |

*Primary Examiner*—Olik Chaudhuri
*Assistant Examiner*—Phat X. Cao
*Attorney, Agent, or Firm*—Mattingly, Stanger & Malur, P.C.

[57] ABSTRACT

A BGA type semiconductor device which realizes its high speed operation and high integration density by shortening power supply or grounding wires to reduce its inductance. In the BGA type semiconductor device, the power supply or grounding wires are provided in the vicinity of the center of a BGA board to realize the high-speed operation and high integration density, whereby an electronic circuit or equipment using the BGA type semiconductor device can be made high in operational speed and made sophisticated in function.

6 Claims, 7 Drawing Sheets

BGA TYPE SEMICONDUCTOR DEVICE AND ELECTRONIC EQUIPMENT USING THE SAME

BACKGROUND OF THE INVENTION

The present invention relates to semiconductor devices and electronic equipment or apparatuses using such semiconductor devices and more particularly, to a semiconductor device which operates at a very high speed and realizes a very high integration density and also to electronic equipment or apparatuses using such semiconductor devices.

Electronic equipment have been significantly advanced and remarkable progresses have been continued in recent years particularly in improving an operational speed or in achieving a higher integration. When high-speed electronic equipment is available, various sorts of processings can be realized easily and inexpensively. Further, improvement of the integration density enables realization of a sophisticated function. This tendency is remarkable, in particular, in a semiconductor device field. In this way, the improvement in the operational speed of electronic circuits, electronic equipment and semiconductor devices as well as the higher integration thereof are becoming the motive of advances and developments of the electronic industry.

A higher integration of semiconductor device increases the number of circuits to be incorporated in the device to thereby increase the number of pins of the semiconductor device necessary for connection with other devices. One of solutions to the above problem is disclosed in the specification of U.S. Pat. No. 5,216,278 which is directed to such a technique as to employ a ball grid array (BGA) package. The semiconductor device is accommodated in the BGA package to thereby form a BGA type semiconductor device.

Explanation will be made as to a prior art BGA type semiconductor device with reference to drawings.

FIG. 9 is a top view of a BGA board 1 for use in a BGA type semiconductor device. In the figure, a BGA board 1 is a wiring board which comprises a printed circuit board of organic material or ceramic. It is the semiconductor element that is mounted at a semiconductor device mounting area or position 5 in the center of the BGA board 1. Bonding pads 4 are provided on the BGA board 1 for bonding. The pads 4 and electrodes on the semiconductor element are electrically connected by bonding wires or the like. Extended substantially radially from the respective bonding pads 4 are a pattern of wires 3 which in turn are connected at their one ends with associated through holes 2. The density of the patterned wires 3 is high in the center of the BGA board 1. For the purpose of avoiding this, the through holes 2 are arranged along the outer periphery of the BGA board 1.

FIG. 10 shows a rear view of the BGA board 1. In the figure, the through holes 2 are used to interconnect the front and rear wiring lines of the BGA board 1. More in detail, on the rear side of the BGA board 1, wiring lines 6, which extend from the associated through holes 2, are connected to soldering pads 7. The pads 7 are arranged in a two-dimensional positional relation. More specifically, in the example of FIG. 10, the soldering pads in 3 rows are arranged along the four sides of the board 1 not in a single row but in a two-dimensional arrangement having a width.

FIG. 11 shows a cross-sectional view of a major part of the BGA board 1 under such a condition that a semiconductor element 8 is mounted on the BGA board 1. Electrodes on the semiconductor element 8 and the bonding pads 4 on the bonding pads 4 are connected by bonding wires 9. The wiring extends from the bonding pads 4 via the patterned wires 3, through holes 2 and wiring lines 6 to the soldering pads 7. Connected to the soldering pads 7 are solder balls 10. Though not illustrated, the BGA type semiconductor device is mounted on a printed circuit board by means of the solder balls 10 to be electrically connected to other device.

The aforementioned BGA type semiconductor device features that this type of device can have a more increased number of pins than another package such as dual in-line package (DIP) or quad flat package (QFP), under the same outer dimensions. This feature results from the fact that the soldering pads 7 shown in FIG. 10 are arranged in the 2-dimensional form which does not exist in the other packages. For this reason, even when a higher integration of semiconductor device increases the number of circuits to be incorporated therein and also the number of pins therefor, there can be realized a semiconductor device which prevents its outer dimensions from being made large in scale, which contributes to the advances and developments of the electronic industry.

SUMMARY OF THE INVENTION

However, when a semiconductor device is further improved in its operational speed or when its integration is further enhanced, it may sometimes occur that the conventional BGA type semiconductor device cannot cope with it.

One of important factors upon using the semiconductor device is power supply noise. When the semiconductor device operates, it consumes power. Since current consumption varies depending on the operation of its internal circuits, power supply noise is caused by the impedance of wires in a power supply system. Assuming that power supply noise is denoted by $\Delta V$, the impedance of a power supply system is by Z, and current consumption variation is by $\Delta I$; then a relationship among these 3 factors is expressed by an equation $\Delta V = Z \times \Delta I$.

In the case of the semiconductor device, the impedance of the power supply system is based on an inductance L of wires within the semiconductor device. Accordingly, assuming that the semiconductor device has an operational frequency f, then the impedance Z of the power supply system satisfies an equation $Z = 2\pi f L$.

In the case of the printed circuit board having the semiconductor device mounted thereon, since the impedance of the power supply system is suppressed to a low value by a bypass capacitor, planar power supply/grounding wirings or other means; the impedance of the entire power supply system is, in many cases, based primarily on the inductance L of wires within the semiconductor device.

Therefore, as expressed by $\Delta V = 2\pi f L \times \Delta I$, the power supply noise $\Delta V$ is generated by the operational frequency f, the inductance L of wires within the semiconductor device and the current consumption variation component $\Delta I$.

When the power supply noise becomes excessive, the semiconductor device erroneously operates. This is because a power supply voltage deviates from a normal operational range of the circuit within the semiconductor device, or the power supply noise is superimposed on signal wirings to cause erroneous operation of other circuits. For this reason, if the power noise is not suppressed to a prescribed value or less, erroneous operation occurs in the semiconductor device, thus disabling use of the device.

When the operational frequency f of the semiconductor device is increased, this causes an increase of the power supply noise in accordance with the aforementioned equation $\Delta V = 2\pi f L \times \Delta I$ and thus the erroneous operation of the semiconductor device, which sometimes results in that the semiconductor device becomes impossible to use.

Further, when a higher integration of semiconductor device and an increase in the number of circuits to be incorporated therein result in an increase in the current consumption, this also causes an increase of the current consumption variation ΔI. Thus, the power supply noise increases in accordance with the above equation ΔV=2 πfL×ΔI and erroneous operation takes place in the semiconductor device, thus leading to disabled use of the semiconductor device.

Furthermore, in the case of, in particular, a CMOS semiconductor device, improvement in the operational frequency f of the semiconductor device causes the current consumption to increase in proportion to the frequency. This also results in that the power consumption variation ΔI is increased to increase the power supply noise in accordance with the above equation ΔV=2 πfL×ΔI, which may lead to the fact that the semiconductor device erroneously operates and becomes impossible to use.

The above will be explained in more detail in conjunction with a prior art example shown in FIGS. 9 to 11.

The linewidth of the patterned wires 3 and wiring lines 6 shown in FIGS. 9 to 11 was 0.15 mm, while the length thereof was both 5 mm. The through holes 2 had a diameter of 0.3 mm and a length (depth) of 0.8 mm. Further, the bonding wires 9 had a diameter of 0.04 mm and a length of 2 mm.

With such a structure as mentioned above, the wiring lines of the BGA board part, i.e., wiring lines including the patterned wires 3, wiring lines 6 and through holes 2 had an inductance of 5.1 nH, the bonding wire part had an inductance of 1.7 nH, and the total of the both inductances was 6.8 nH. Since the prior art BGA type semiconductor device had 5 power supply wiring lines and 5 grounding wiring lines, the total inductance Lo was 2.72 nH (=(6.8 nH/5)+(6.8 nH/5)). In this way, the wiring lines of the power supply system within the prior art BGA type semiconductor device had an inductance Lo of 2.72 nH.

The aforementioned prior art BGA type semiconductor device normally operated at the operational frequency of 110 MHz with the current consumption variation ΔI of 0.5 A. In this case, the power noise ΔV of the BGA type semiconductor device was 0.94 V (=2π×110 MHz×2.72 nH×0.56 A) and the allowable power supply noise thereof was 1 V or less. Accordingly, the aforementioned prior art BGA type semiconductor device had limits of the above conditions, i.e., the operational frequency limit of 110 MHz and the current consumption variation limit of 0.5 A.

Therefore, in such a prior art BGA type semiconductor device as shown in FIGS. 9 to 11, when the operational frequency or current consumption further increases, the power supply noise exceeds its allowable level, thus resulting in that the semiconductor device erroneously operates and becomes impossible to use.

In this way, when the operational speed of the semiconductor device is further improved or when the integration density is further increased, the prior art BGA type semiconductor device cannot correspondingly cope with it.

It is therefore an object of the present invention to provide a BGA type semiconductor device which can solve the above problem in the prior art and which can realize its higher-speed operation or higher integration density, and also to provide electronic equipment using the semiconductor device.

The above object is attained by providing a BGA type semiconductor device which can solve the above problem in the prior art. In accordance with an aspect of the present invention, there is provided a BGA type semiconductor device in which an array of wires for a power supply system within the semiconductor device is provided separately from other wires (more specifically, signal wires) to shorten the length of the wires for the power supply system, or the number of wires for the power supply system is increased, to reduce the inductance of the power supply system, thereby coping with the further improvement of the operational speed of the semiconductor device and with an additional increase in the integration density thereof.

More specifically, a semiconductor device according to the present invention is made up of a substrate, a semiconductor chip disposed on the upper surface of the substrate and a plurality of soldering pads provided on the lower surface of the substrate, wherein the substrate has a first group of through holes connected to signal wirings of the semiconductor chip and formed in an inner part from the periphery of the substrate and a second group of through holes connected to power supply wirings or grounding wirings of the semiconductor chip and disposed in a part of the substrate extending from the periphery of a semiconductor chip mounting area.

With the arrangement, it becomes possible to reduce the wiring length of the power supply system shorter than that of the signal wirings or increase the number of wirings of the power supply system, which in turn brings about the effect of reduced inductance of the power supply system.

Preferably, on the substrate upper surface are provided first bonding pads to connect signal terminals of the semiconductor chip with the signal wires and second bonding pads to connect power supply terminals or ground terminals of the semiconductor chip with the power supply wirings or returning (grounding) wires, the second bonding pads being disposed between the first bonding pads and the semiconductor chip. With the bonding pad arrangement as above, the second group of through holes for power supply or grounding can be formed without affecting wiring patterns, thereby making a high density packaging possible.

Here, the "inner part from the periphery of the substrate" refers to an area 100 shown in FIG. 1 and the "part of the substrate extending from the periphery of a semiconductor chip mounting area" refers to an area 200 shown in FIG. 1. FIG. 1 will be described in more detail later.

Preferably, denoting the length of the one side of the substrate as a and the length of one side of the semiconductor chip as b, the inner part from the periphery of the substrate is a geographical range extending from the periphery of the substrate to (a–b)/8 and the part of the substrate extending from the periphery of a semiconductor chip mounting area is a geographical range extending from the periphery of the semiconductor chip to (a–b)/8. By forming the first and second groups of through holes within these geographical ranges, respectively, the wiring length of the power supply system can be reduced to a fourth of the length of the signal wirings, which in turn can reduce the inductance.

To summarize, in a semiconductor device according to the present invention, the array of the wires for the power supply system is arranged in the center of the BGA type semiconductor device to make the length of the wires of the power supply system shorter than that of signal wires, or the number of wires for the power supply system is increased to thereby reduce its inductance.

Further, when the BGA type semiconductor device of the present invention is applied to electronic equipment or apparatuses, the electronic equipment or apparatuses per se can operate at high speed.

DESCRIPTION OF THE PREFERRED EMBODIMENTS

The present invention will be explained in the following with reference to the attached drawings.

Figure 1:
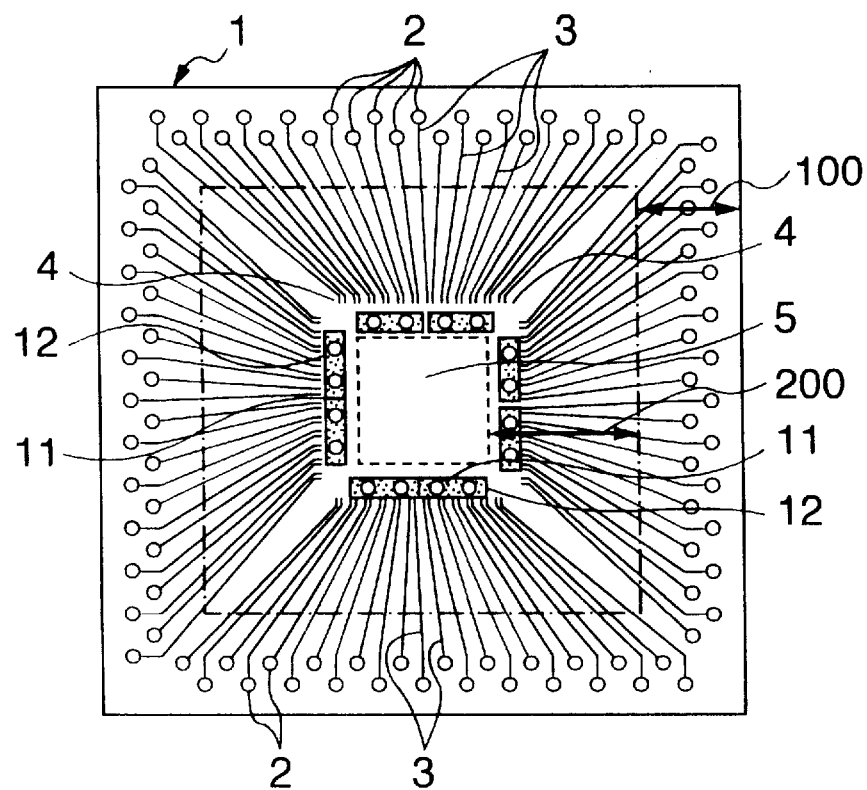
FIG. 1 is a top view of a BGA board for use in a BGA type semiconductor device in accordance with an embodiment of the present invention.
Figure 2:
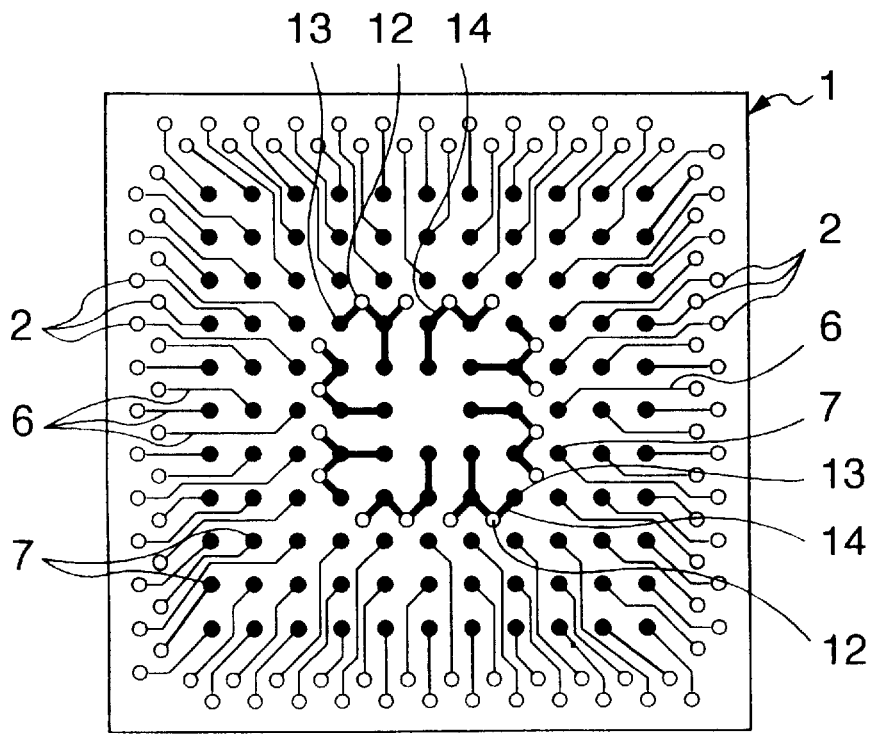
FIG. 2 is a rear view the BGA board of the BGA type semiconductor device in accordance with the embodiment of the present invention.
Figure 3:
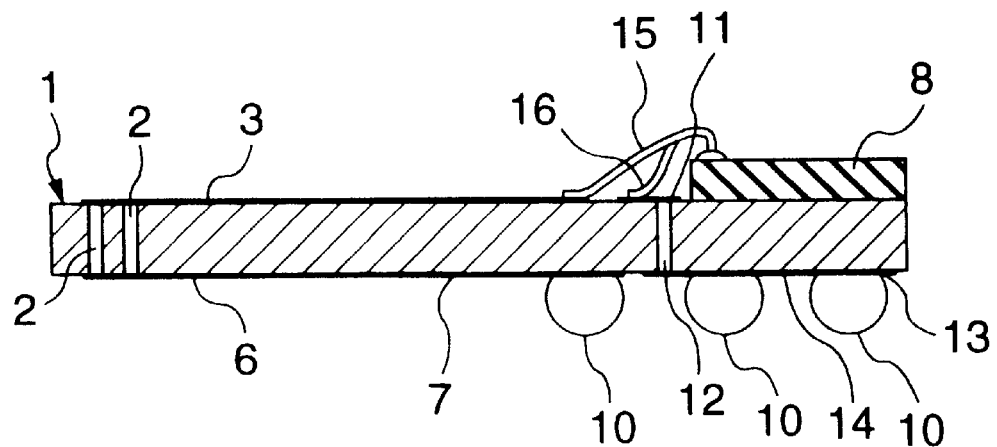
FIG. 3 is a cross-sectional view of a major part of the BGA board in the embodiment of the present invention when a semiconductor element is mounted on the board.

FIGS. 1 to 3 are diagrams for explaining a BGA type semiconductor device in accordance with a first embodiment of the present invention, wherein FIG. 1 is a top view of a BGA board in the BGA type semiconductor device, FIG. 2 is a rear view of the BGA board, and FIG. 3 is a cross-sectional view of a major part of the BGA board when a semiconductor element is mounted on the BGA board.

In FIGS. 1 to 3, the illustrated BGA type semiconductor device includes a BGA board 1, through holes 2, a pattern of wires 3, bonding pads 4, a semiconductor device mounting area or position 5 in the center of the BGA board 1, wiring lines 6, soldering pads 7, a semiconductor element 8, solder balls 10, power supply pads 11, through holes 12, soldering pads 13, a pattern of wiring lines 14, and bonding wires 15 and 16.

As shown in FIG. 1, the BGA board 1 is provided on its upper side with the bonding pads 4 and the patterned wires 3 having a linewidth of 0.15 mm, the patterned wires 3 being connected at their one ends to the associated through holes 2. These holes are used for connection between signal wire lines (the term "signals" as used herein refers to all signals other than a power supply and a grounding, which include, for example, a test signal). Provided in the vicinity of the semiconductor device mounting area or position 5 are the power supply pads 11 which are used for connection with the power supply or grounding wires. The power supply pads 11 are connected to the through holes 12.

As shown in FIG. 2, on the rear side of the BGA board 1, the wiring lines 6 are arranged to be connected to the through holes 2 and the soldering pads 7 are arranged to be connected to the wiring lines 6 for connection with signal wires. Arranged in the center of the rear side of the BGA board 1 are the patterned wiring lines 14 having a linewidth of 0.3 mm which are connected to the through holes 12 as well as the soldering pads 13 which are connected to the patterned wiring lines 14 for connection with the power supply and grounding wires. The patterned wiring lines 14 for the power supply system have a wide linewidth to reduce its inductance, and the through holes 12 and soldering pads 13 are interconnected such that some of the through holes and associated soldering pads are connected in a 1:1 relation by single wiring lines and some other through holes and associated soldering pads are connected in the same way but by means of a plurality of wiring lines.

As shown in FIG. 3, electrodes (signal electrodes) of the semiconductor element 8 mounted on the BGA board 1 are connected to the patterned wires 3 by the bonding wires 15 and are further connected to the soldering pads 7 through the patterned wires 3, through holes 2 and wiring lines 6. The soldering pads 7 are connected with the solder balls 10 for connection with the signal wires. Further arranged in the center of the BGA board 1 are electrodes (power supply and grounding electrodes) of the semiconductor element 8 and the power supply pads 11 which are connected by the bonding wires 16, and further connected via the power supply pads 11, through holes 12 and patterned wiring lines 14 to the soldering pads 13. The soldering pads 13 are connected with the solder balls 10 for connection with the power supply and grounding wires.

In the structure of the first embodiment, 8 sets of the power supply wires and 8 sets of the grounding wires are arranged inside of the signal wires radially arranged, so that the number of such signal wires can be avoided from being reduced and rather the need for the radially-arranged wires to be used as the power supply or grounding wires can be avoided, with the result that the number of such signal wires is increased.

In the first embodiment, the power supply and grounding wires are connected from the semiconductor element 8 to the power supply pads 11 arranged in close proximity to the semiconductor element 8 by means of the bonding wires 16, and are further connected from the power supply pads 11 via the through holes 12 and the patterned wiring lines 14 having a linewidth of 0.3 mm and a length of about 2 mm to the soldering pads 13 for power supply and grounding. Since these wiring paths are short, they have a small inductance. In the present embodiment, the inductance of the wiring path was 1.5 nH. The bonding wire 16, which has a diameter of 0.04 mm and a length of 1.7 mm, had an inductance of 1.4 nH. Therefore, the inductance of the path extending from the semiconductor element 8 to the soldering pads 13 was 2.9 nH in total. The bonding wires, through holes and wires for the power supply are provided in 8 sets, and the bonding wires, through holes and wires for the grounding are provided also in 8 sets. Thus, the overall inductance Lo is theoretically 0.73 nH (=(2.9 nH/8)+(2.9 nH/8)), but it became actually 0.60 nH because of the effect of use of the plurality of wires.

The first embodiment having such an arrangement as mentioned above was capable of operating at the operational frequency of 500 MHz with the current consumption variation $\Delta I$ of 0.5 A. That is, the power supply noise $\Delta V$ became 0.94 V (=$2\pi \times 500$ MHz$\times 0.60$ nH$\times 0.5$ A) that was less than the allowable power noise of 1 V.

The first embodiment was also capable of operating at the operational frequency of 110 MHz with the current consumption variation ΔI of 2.3 A. That is, the power noise ΔV became 0.95 V (=2π×110 MHz×0.60 nH×2.3 A) that was less than the allowable power noise of 1 V.

Although the allowable power noise was set to be 1 V or less, the operational frequency was to be 110 MHz and 500 MHz, and the current consumption variation was to be 0.5 A and 2.3 A, respectively, in the present embodiment; the present invention is not limited to the specific examples.

That is, since the present invention can make its inductance smaller than that of the prior art BGA type semiconductor device, even when operated at high speeds at various set values, the present invention can secure its normal operation.

In other words, the allowable ranges for the respective conditions when the invention operates at high speed can be loosen and therefore the design including the BGA type semiconductor device can be facilitated.

20 to 30% of the power supply value are usually set as the allowable power supply noise, and 1 A or less of the current is, in many case, set as the current consumption variation (which is generally regarded as equivalent to the current consumption value of a LSI). Even when the the device according to the first embodiment is set under such conditions, it can normally operate at higher speed than the prior art.

The same holds true for a second embodiment which follows.

Figure 4:
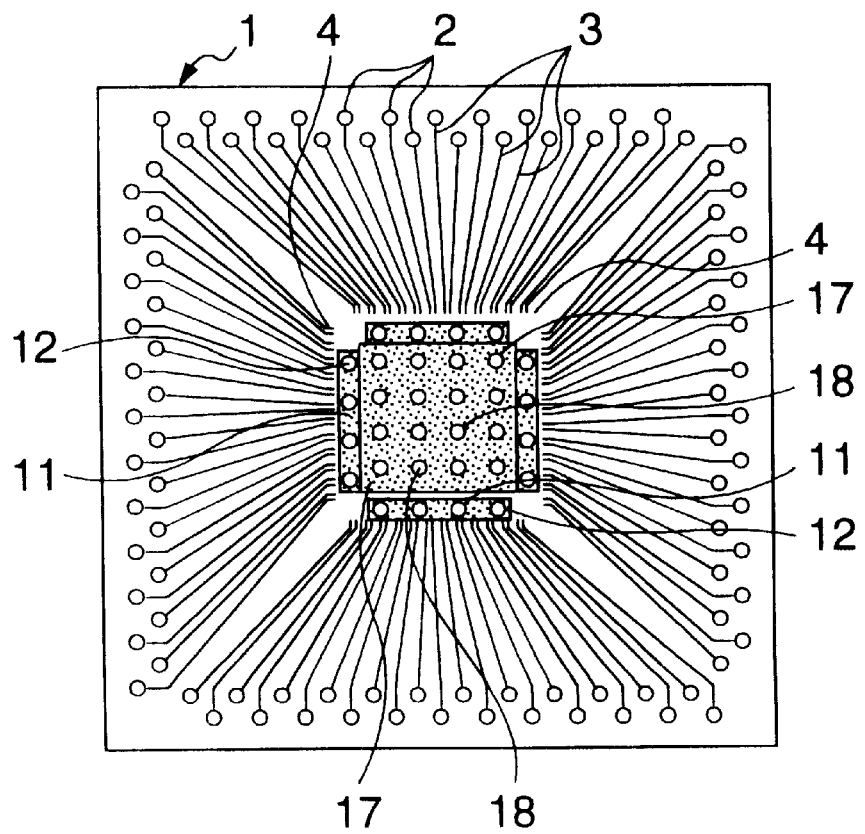
FIG. 4 is a top view of a BGA board for use in a BGA type semiconductor device in accordance with another embodiment of the present invention.
Figure 5:
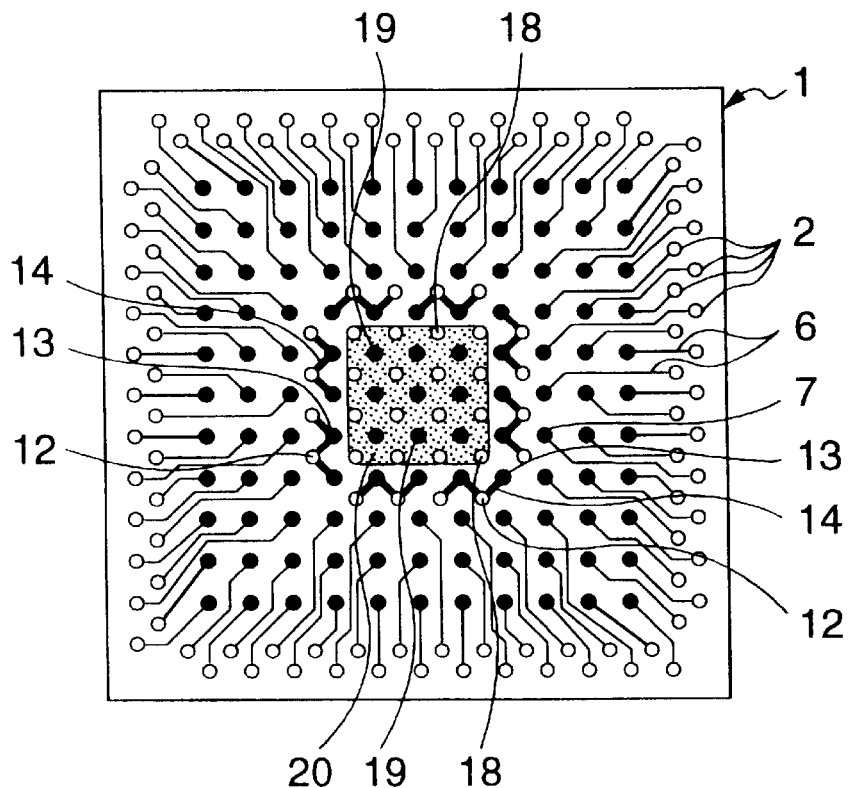
FIG. 5 is a rear view the BGA board of the BGA type semiconductor device in accordance with the other embodiment of the present invention.
Figure 6:
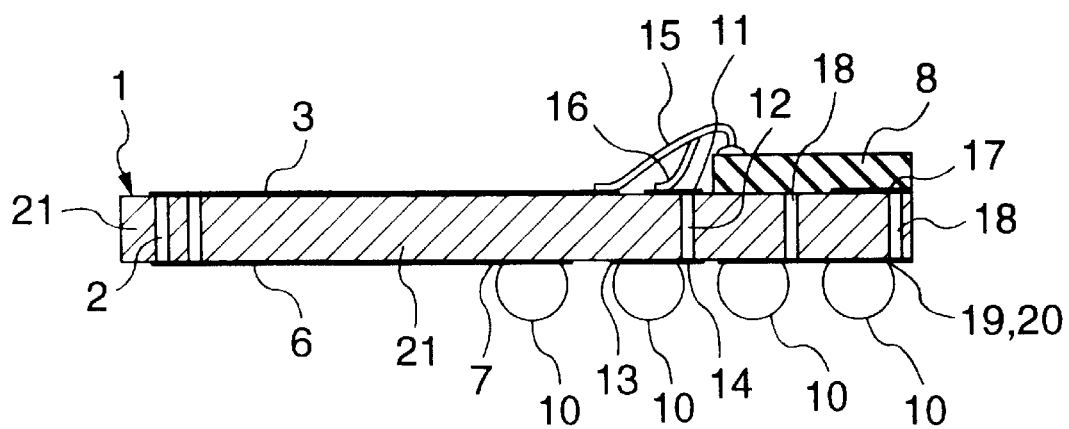
FIG. 6 is a cross-sectional view of a major part of the BGA board in the other embodiment of the present invention when a semiconductor element is mounted on the board.

FIGS. 4 to 6 are diagrams for explaining a BGA type semiconductor device in accordance with the second embodiment of the present invention, wherein FIG. 4 is a top view of a BGA board used in the BGA type semiconductor device, FIG. 5 is a rear view of the BGA board, and FIG. 6 is a cross-sectional view of a major part of the BGA board when a semiconductor element is mounted on the BGA board. In FIGS. 4 to 6, constituent elements having substantially equivalent functions to those in the first embodiment of FIGS. 1 to 3 are denoted by the same reference numerals, and explanation thereof is omitted to eliminate its duplication.

The BGA type semiconductor device illustrated in FIGS. 4 to 6 includes semiconductor element electrodes 17, through holes 18, soldering pads 19, a pattern of planar wiring lines or sheet pattern 20, and an internal pattern 21.

As shown in FIG. 4, the BGA board 1 is provided on its top side with the bonding pads 4 and the patterned wires 3 having a linewidth of 0.15 mm, the patterned wires 3 being connected to the through holes 2 for connection with signal wires.

The semiconductor element 8 is mounted on the semiconductor element electrodes 17 provided in the center of the BGA board 1, the semiconductor element electrodes 17 in turn being connected with grounding electrodes formed on the rear side of the semiconductor element 8. The semiconductor element electrodes 17 are connected to the through holes 18 for connection with grounding wires.

Provided in the vicinity of the semiconductor element electrodes 17 are the power supply pads 11 which are connected to the through holes 12 for connection with power supply wires.

As shown in FIG. 5, arranged on the rear side of the BGA board 1 are the wiring lines 6 which are connected to the through holes 2 as well as the soldering pads 7 which are connected to the wiring lines 6 for connection with signal wires.

Provided in the center of the rear side of the BGA board 1 is the planar pattern of the wiring lines or sheet pattern 20 which are connected to the associated through holes 18. Formed on the planar patterned wiring lines or sheet pattern 20 with use of a solder resist mask are the soldering pads 19 which are used for connection with grounding wires.

Also arranged at positions close to the outer periphery of the planar or sheet pattern 20 and closer to the center of the BGA board 1 are the patterned wiring lines 14 having a linewidth of 0.3 mm which are connected to the through holes 12 as well as the soldering pads 13 which are connected to the patterned wiring lines 14 for connection with power supply wires. The linewidth of the patterned wiring lines 14 for connection with the power supply wires was made wide to reduce the impedance. Further, the through holes 12 and the soldering pads 13 are connected together such that some of the through holes and associated soldering pads are interconnected in 1:1 relation by single wiring lines and some other through holes are interconnected in a 1:1 relation by a plurality of wiring lines.

As shown in FIG. 6, electrodes (signal electrodes) of the semiconductor element 8 mounted on the BGA board 1 are connected to the patterned wires 3 by the bonding wires 15 and further connected to the soldering pads 7 through the patterned wires 3, through holes 2 and wiring lines 6. The soldering pads 7 are connected with the solder balls 10 for connection with signal wires.

In the center of the BGA board 1, the grounding electrodes of the rear side of the semiconductor element 8 are connected to the semiconductor element electrodes 17 and further connected to the soldering pads 19 via the semiconductor element electrodes 17, through holes 18 and planar patterned wiring lines or sheet pattern 20. The soldering pads 19 are connected with the solder balls 10 for connection with the grounding wires.

Arranged at positions closer to the center of the BGA board 1 are electrodes (power supply electrodes) of the semiconductor element 8 and the power supply pads 11 which are connected together by the associated bonding wires 16, and further connected to the soldering pads 13 through the power supply pads 11, through holes 12 and patterned wiring lines 14. The soldering pads 13 are connected with the solder balls 10 for connection with the power supply wires.

In the second embodiment, for the purpose of controlling the characteristic impedance of the signal wires and reducing crosstalk, the internal pattern 21 is provided within the BGA board 1. The internal pattern 21 is, in the illustrated example, connected to the grounding through holes 18 and also isolated from the other through holes 2 and 12.

In the structure of the second embodiment, the ground connection of the semiconductor element 8 is carried out by connecting the grounding electrodes to the soldering pads 19 through the 16 through holes 18 without using any line-shaped wirings. Further, the power supply wires are provided in the form of 16 sets of the bonding wires, through holes and wiring lines, which are all located inside the signal wires radially arranged. Therefore, the number of such signal wires can be prevented from being reduced and rather the need for the power supply or grounding wires to be radially arranged can be avoided, which results in that the number of the signal wires is increased.

In the second embodiment, the major contribution to the inductance of the grounding wires is only the through holes 18. Accordingly, an inductance per through hole is as small as 0.25 nH when the through holes 18 have a diameter of 0.3 mm and a length (depth) of 0.8 mm.

The power supply wires are connected by the bonding wires 16 from the semiconductor element 8 to the power supply pads 11 located very close to the semiconductor element 8, and further connected from the power supply pads 11 to the soldering pads 13 through the through holes 12 and the patterned wiring lines 14 having a linewidth of 0.3 mm and having a length of about 2 mm. Since the wire paths are short, the inductance was small and in the second embodiment, 1.5 nH. The bonding wires 16 had a diameter of 0.04 mm, a length of 1.7 mm, and an inductance of 1.4 nH. Accordingly, the inductance per one wiring line extended from the top of the semiconductor element 8 to the soldering pads 13 is 2.9 nH in total.

16 sets of the power supply wires and 16 sets of the grounding wires are provided. Thus, the overall inductance Lo is theoretically 0.20 nH (=(2.9 nH/16)+(0.25 nH/16)), but was actually 0.19 nH because of the effect of use of the plurality of power supply lines.

The second embodiment having such an arrangement as mentioned above was capable of operating at the operational frequency of 1600 MHz with the current consumption variation ΔI of 0.5 A. The power noise ΔV was 0.96 V (=2π×1600 MHz×0.19 nH×0.5 A) and the allowable power noise was 1 V or less.

The second embodiment was capable of operating at the operational frequency of 110 MHz with the current consumption variation ΔI of 7.3 A. That is, the power noise ΔV was 0.96 V (=2π×110 MHz×0.19 nH×7.3 A) that was less than the allowable power noise of 1 V.

FIGS. 1 and 2 and FIGS. 4 and 5 are the BGA boards 1 which form a third embodiment of the present invention and which can be commercialized by itself.

In these BGA board 1, as already explained above, the soldering pads for the power supply or grounding, which are arranged in the center of the BGA board, have a wiring inductance of about 0.60 nH with respect to the structure of FIGS. 1 and 2 and of about 0.19 nH with respect to the structure of FIGS. 4 and 5.

In the case of the structure of FIGS. 1 and 2, the third embodiment can operate at the operational frequency of 500 MHz with the current consumption variation ΔI of 0.5 A or at the operational frequency of 110 MHz with the current consumption variation ΔI of 2.3 A. In the case of the structure of FIGS. 4 and 5, on the other hand, the third embodiment can operate at the operational frequency of 1600 MHz with the current consumption variation ΔI of 0.5 A or at the operational frequency of 110 MHz with the current consumption variation ΔI of 7.3 A.

Figure 7:
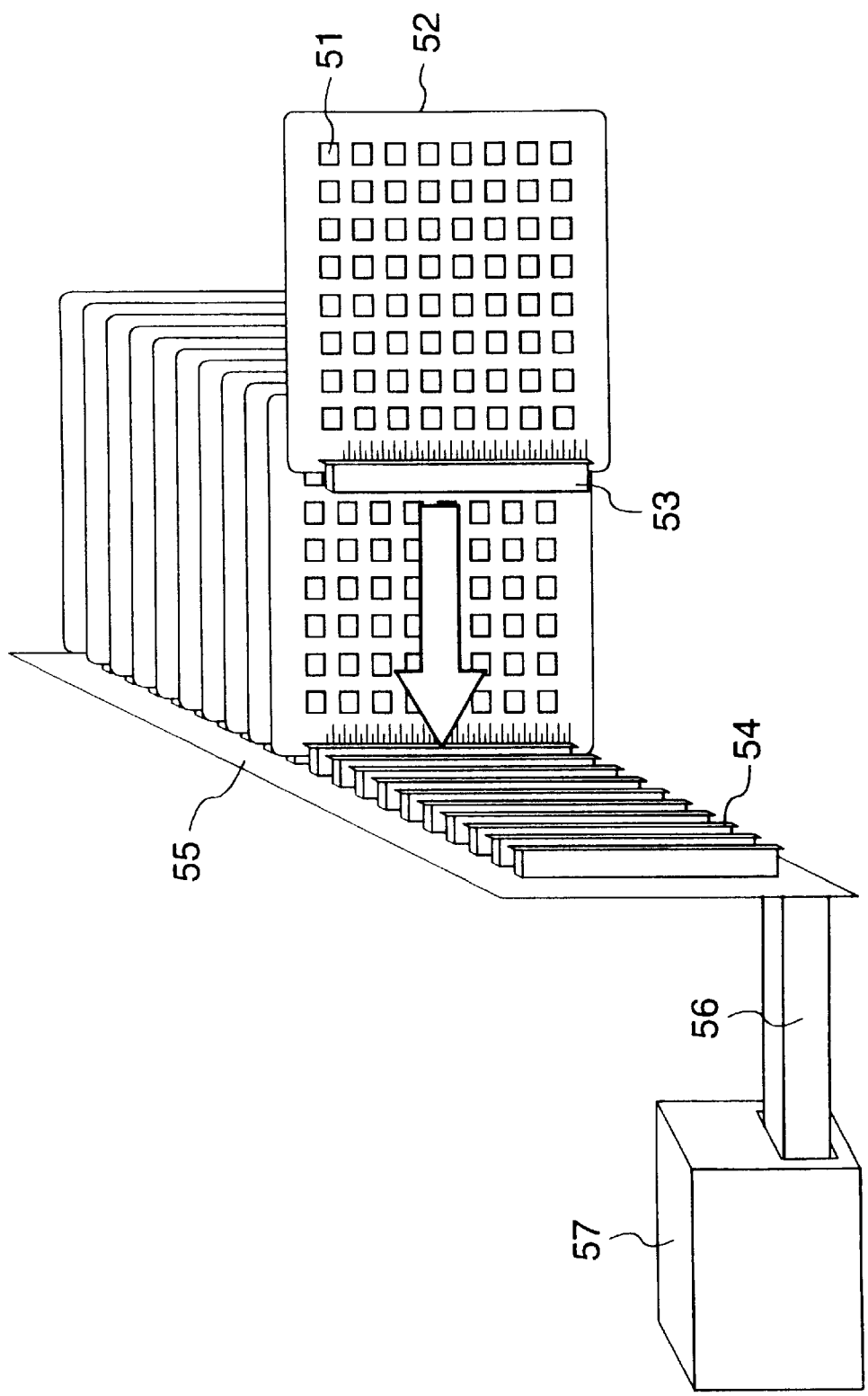
FIG. 7 is a diagram useful for explaining electronic equipment having the BGA type semiconductor device of the present invention mounted therein.

FIG. 7 shows electronic equipment in accordance with a fourth embodiment of the present invention.

In FIG. 7, a plurality of BGA semiconductor devices 51 in accordance with the first embodiment or a plurality of BGA semiconductor devices 51 in accordance with the second embodiment are mounted on a printed circuit board 52, the printed circuit board 52 in turn being connected to a back board 55 through connectors 53 and 54, the back board 55 in turn being supplied with power from a power supply device 57 through a power supply cable 56. In the drawing, a casing, switches, wiring lines leading to other parts, etc. are omitted.

In the fourth embodiment, since the BGA type semiconductor devices of the present invention are mounted in the semiconductor equipment, the semiconductor equipment can operate at high speed with a high integration.

Figure 8:
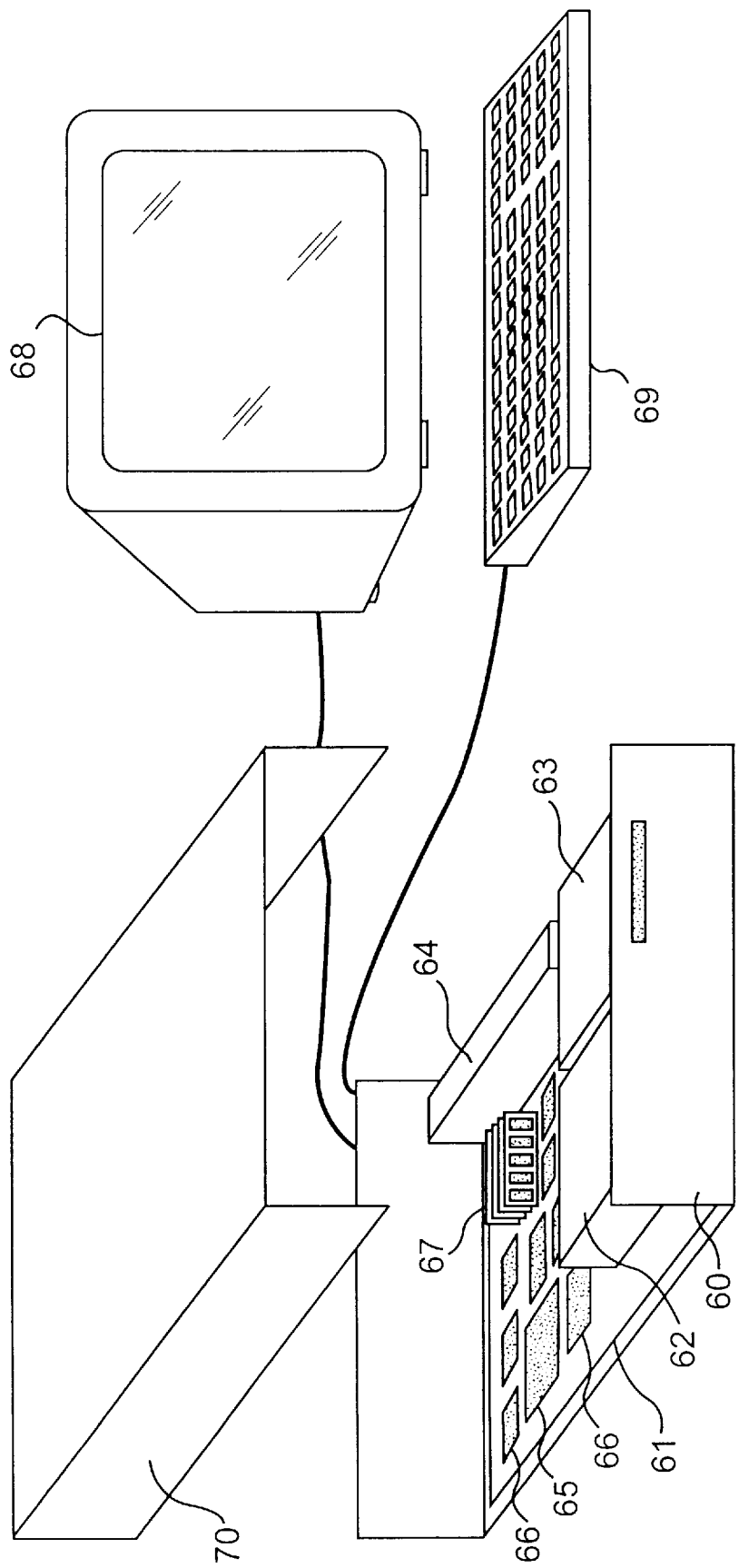
FIG. 8 is a diagram useful for explaining electronic equipment having the BGA semiconductor device mounted therein.
Figure 9:
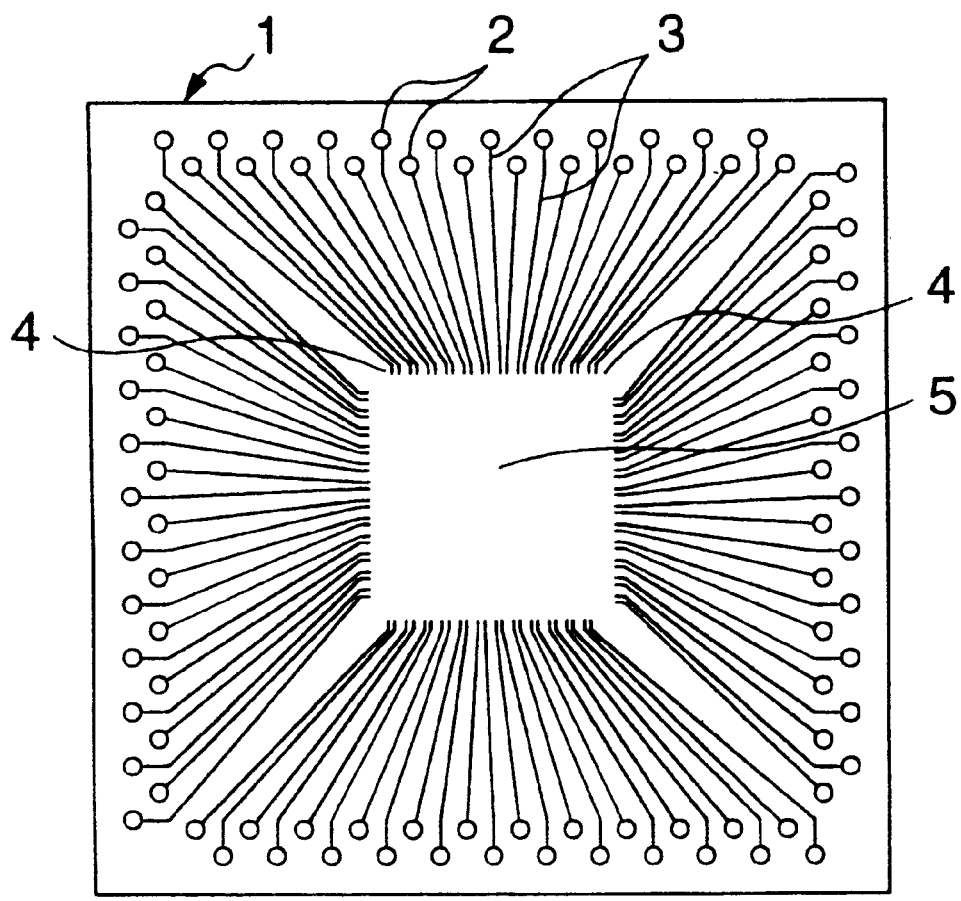
FIG. 9 is a top view of a BGA board for use in a prior art BGA type semiconductor device.
Figure 10:
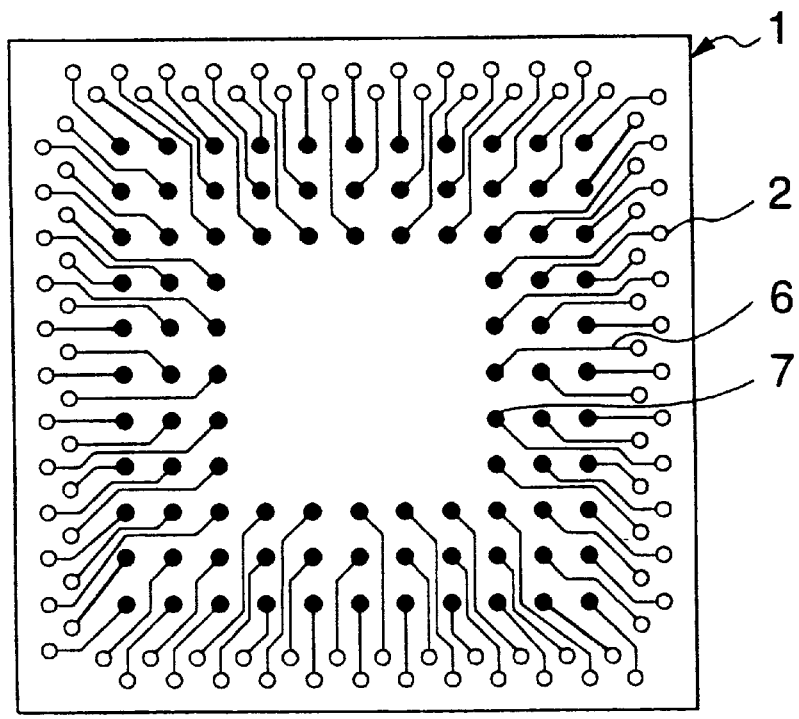
FIG. 10 is a rear view of the BGA board for use in the prior art.
Figure 11:
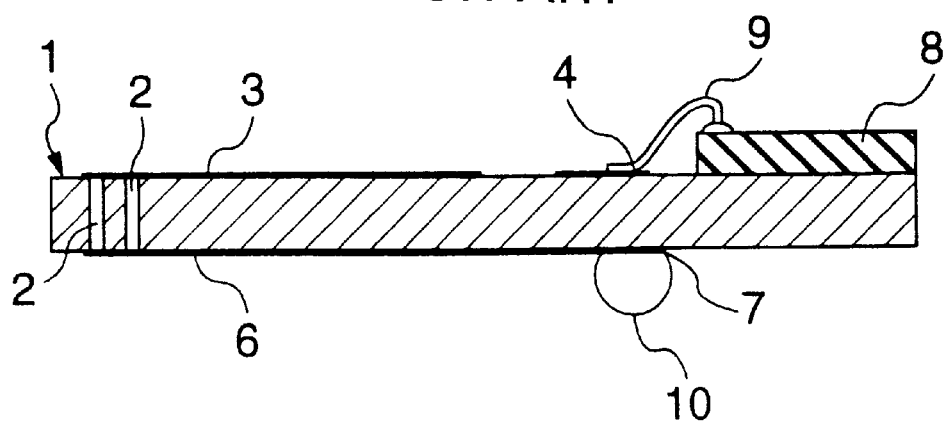
FIG. 11 a cross-sectional view of a major part of the BGA board in the prior art BGA type semiconductor device when a semiconductor element is mounted on the board.

FIG. 8 shows electronic equipment and more specifically, an electronic computer in accordance with a fifth embodiment of the present invention.

The computer illustrated in FIG. 8 includes a computer body 60, a display unit 68 and a keyboard 69. Incorporated in the computer body 60 are a hard disk drive 62, a floppy disk drive 63, a power supply 64 and a printed circuit board 61. Mounted on the printed circuit board 61 are central processing unit (CPU) 65 comprising the BGA type semiconductor device, another semiconductor device 66 and a memory 67.

In the embodiment of FIG. 8, the CPU 65, which comprises the BGA type semiconductor device, can operate at a frequency of 600 MHz and thus, the entire computer can perform high-speed operation.

It goes without saying that, with the same arrangement, a high integration of BGA semiconductor device can be used in the CPU 65 to improve the processing ability of the computer.

The electronic equipment of these fourth and fifth embodiments, when the BGA semiconductor device is used therein, can operate at high speed with high function, thus contributing to the advances and developments of the electronic industry.

Though all the power supply or grounding wires are arranged to concentrate in the vicinity of the center of the BGA board in the embodiment, the present invention is not restricted to the specific example and such arrangement may be partially carried out for a particular design requirement without defeating the effect of the present invention.

Further, the arrangement of the first embodiment and the arrangement of the second embodiment may be mixedly employed.

Although the grounding electrodes have been provided on the rear side of the semiconductor element from the viewpoint of its design in the second embodiment, the power supply electrodes may be provided on the rear side of the semiconductor element, while exhibiting the effect of the present invention substantially equivalent to the former case.

The grounding internal layer has been provided within the BGA board in the second embodiment. However, the internal layer may be for power supply, may be one layer of a multi-layer, or may include the signal wires, without involving deterioration of the effect of the present invention.

Though the interconnection between the semiconductor element and BGA board is effected by means of the bonding wires in the embodiment, it may be carried out by another means, e.g., by a tape automated bonding (TAB) technique or a solder ball technique, without deteriorating the effect of the present invention.

Further, although the semiconductor element and soldering pads have been arranged on a plane different from the plane of the BGA board in the embodiment, they may be arranged on the same plane without impairing the effect of the present invention. In the latter case, the through holes used in the embodiment may not be used.

Even when the positional arrangement of the soldering pads and bonding pads is changed for reasons other than the technical reasons of the present invention, the present invention is still effective.

The present invention is, of course, applicable not only to BGA type semiconductor devices but also to PGA type semiconductor devices.

As has been explained in the foregoing, in accordance with the present invention, there is provided a BGA type semiconductor device which can further improve its operational speed and integration density. For example, the operational frequency can be increased to 500 MHz–1600 MHz that corresponds to 4.5–14.5 times the operational frequency of 110 MHz in the prior art. Further, the current consumption variation can be increased to 2.3 A–7.3 A which corresponds to 4.6–14.6 times the current consumption variation of 0.5 A in the prior art, and the integration density directly affecting the current consumption, i.e., the number of circuits within the semiconductor device can be increased to 4.6–14.6 times that of the prior art. As a result, an electronic circuit or equipment using the semiconductor devices of the present invention can operate at high speed and can be made sophisticated in function, thus contributing to the advances and developments of the electronic industry.

The above advantageous effects result from the fact that the power supply or grounding wires are shortened to reduce its inductance. A total length of the power supply wires on the BGA board was 10 mm that is equal to the length of the shortest signal wires in the prior art, whereas, in the second and third embodiment of the present invention, the lengths of the power supply and signal wires were 2 mm and 1.7 mm, respectively, that are ⅕ or less the shortest signal wire length and thus the inductance was reduced from 6.8 nH to 0.60 mH or 0.19 nH that is ¹⁄₁₀ or less thereof. In this way, the essence of the present invention is to arrange the power supply or grounding wires to concentrate in the central part of the BGA board to thereby shorten the wiring line length.

What is claimed is:

1. A semiconductor device, comprising:

a substrate;

a semiconductor chip disposed on an upper surface of the substrate;

a plurality of pads disposed on a lower surface of the substrate;

said substrate having a first group of through holes connected with signal wirings of the semiconductor chip and formed in an inner part from the periphery of the substrate and a second group of through holes connected to power supply wirings and grounding wirings and formed in a part of the substrate extending from the periphery of a semiconductor chip mounting area;

wherein a wiring length from the power supply wirings and grounding wirings to the pads via the second group of through holes are shorter than lengths from the signal terminals to the pads via the first group of through holes, and the length of the power supply wirings and the grounding wirings formed on the lower surface of the substrate are shorter than the length of the signal wirings; and wherein the power supply wirings and grounding wirings formed on the lower surface of the substrate are formed such that the power supply wirings and the ground wirings do not run through inter-pad areas.

2. A semiconductor device, comprising:

a substrate;

a semiconductor chip disposed on an upper surface of the substrate;

a plurality of pads disposed on a lower surface of the substrate;

said substrate having a first group of through holes connected with signal wirings of the semiconductor chip and disposed in an inner part from the periphery of the substrate and a second group of through holes connected with power supply wirings and grounding wirings of the semiconductor chip and disposed in an inner part from the periphery of a semiconductor chip mounting area, said plurality of pads being arranged in an area extending between the first group of through holes and the second group of through holes and also in an area defined by the second group of through holes, wherein the length of wiring from power supply electrodes and grounding electrodes of said semiconductor chip to the pads for power supply and to the pads for grounding is shorter than the length of wiring from the signal electrodes of the semiconductor chip to the pads for the signals of the semiconductor chip, such that power supply noise is reduced when the semiconductor chip is operated at fast operation speeds, and the length of the power supply wirings and the grounding wirings formed on the lower surface of the substrate are shorter than the length of the signal wirings, and wherein the power supply wirings and grounding wirings formed on the lower surface of the substrate are formed such that the power supply wirings and the ground wirings do not run through inter-pad areas.

3. A semiconductor device, comprising:

a substrate having a first group of through holes and a second group of through holes, said second group of the through holes to be disposed in an inner part from the first group of the through holes;

a semiconductor chip having signal terminals, power supply terminals and grounding terminals, said semiconductor chip disposed on a first side of the substrate, said signal terminal to be electrically connected with the first group of through holes, said power supply terminal and said grounding terminal to be electrically connected with the second group of through holes; and a plurality of bumps disposed on a second surface of the substrate;

wherein lengths from the power supply terminal and the grounding terminals to the bumps via the second group of through holes are shorter than lengths from the signal terminals to the bumps via the first group of through holes, and the length of the power supply wirings and the grounding wirings formed on the lower surface of the substrate are shorter than the length of the signal wirings; and wherein the power supply wirings and grounding wirings formed on the lower surface of the substrate are formed such that the power supply wirings and the ground wirings do not run through inter-pad areas.

4. A semiconductor device, comprising:

a substrate having a first group of through holes and a second group of through holes;

a semiconductor chip having signal terminals, power supply terminals and grounding terminals, said semiconductor chip disposed on a first surface of the substrate; and a plurality of bumps disposed on a second surface of the substrate;

wherein lengths from the power supply terminals and the grounding terminals to the bumps via the second group of through holes are shorter than lengths from the signal terminals to the bumps via the first group of through holes; and wherein the power supply wirings and grounding wirings formed on the lower surface of the substrate are formed such that the power supply wirings and the ground wirings do not run through inter-pad areas.

5. A semiconductor device, comprising:

a substrate having a first group of through holes and a second group of through holes, said second group of through holes disposed in an inner part of the substrate from the first group of through holes;

a semiconductor chip having signal terminals, power supply terminals and grounding terminals, said semiconductor chip disposed on a first side of the substrate; and a plurality of bumps disposed on a second surface of the substrate;

wherein said signal terminals are to be electrically connected with the bumps via the first group of through holes, said power supply terminals and said grounding terminals are to be electrically connected with the bumps via the second group of through holes, and the length of the power supply wirings and the grounding wirings formed on the lower surface of the substrate are shorter than the length of the signal wirings; and wherein the power supply wirings and grounding wirings formed on the lower surface of the substrate are formed such that the power supply wirings and the ground wirings do not run through inter-pad areas.

6. A semiconductor device, comprising:

a substrate having a first group of through holes and a second group of through holes, said second group of through holes disposed in an inner part of the substrate, from the first group of through holes;

a semiconductor chip having signal terminals, power supply terminals and grounding terminals, said semiconductor chip disposed on a first surface of the substrate, said signal terminals electrically connected with the first group of through holes, said power supply terminals and said grounding terminals electrically connected with the second group of through holes;

a plurality of bumps disposed on a second surface of the substrate;

wherein a length from the power supply terminals and the grounding terminals to the bump via one of the second group of through holes are shorter than a length from the signal terminals to the bump via one of the first group of through holes so as to reduce power supply noise, and the length of the power supply wirings and the grounding wirings formed on the lower surface of the substrate are shorter than the length of the signal wirings; and wherein the power supply wirings and grounding wirings formed on the lower surface of the substrate are formed such that the power supply wirings and the ground wirings do not run through inter-pad areas.

* * * * *